(12) United States Patent
Takisawa

(10) Patent No.: US 6,377,929 B1
(45) Date of Patent: Apr. 23, 2002

(54) SOLID-STATE AUDIO RECORDING UNIT

(75) Inventor: Yoshinori Takisawa, Kamakura (JP)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/383,289

(22) Filed: Aug. 25, 1999

(30) Foreign Application Priority Data

Aug. 28, 1998 (JP) ........................................... 10-257659

(51) Int. Cl.[7] ............................................. G10L 19/00
(52) U.S. Cl. ........................ 704/500; 704/501; 704/503
(58) Field of Search ................................ 704/500, 258, 704/501, 503; 395/154, 800.16; 365/189.02, 230.02, 230.03, 230.05; 84/603

(56) References Cited

U.S. PATENT DOCUMENTS 5,553,220 A * 9/1996 Keene ......................... 395/154
5,802,385 A * 9/1998 Densham et al. ...... 395/800.16
6,073,100 A * 6/2000 Goodridge, Jr. ............ 704/258

OTHER PUBLICATIONS

"Encyclopedia of Computer Science", Ralston et al., 1993, pp. 142–143.

* cited by examiner

Primary Examiner—Tālivaldis Ivars Šmits
Assistant Examiner—Susan McFadden
(74) Attorney, Agent, or Firm—Edward W. Goodman

(57) ABSTRACT

A solid-state audio recording unit, capable of checking whether normal audio recording is performed or not on a real-time basis, includes one input buffer for receiving incoming audio data operating at a standard speed, another input buffer for writing audio data into a memory 9 operating at a high speed, one output buffer for receiving audio data from the memory 9 operating at a high speed, and another output buffer for delivering audio data as output operating at a standard speed. As such, it is possible to write/read data into/from the memory at a high speed; and thus operation is ensured enabling, on appearance, parallel processing of input and output, even though, in reality, a single memory is shared by the input and output ports; and thus it becomes possible to deliver audio data stored in a memory as an output on a real-time basis.

3 Claims, 5 Drawing Sheets

| Time | SW POSITION | | | | Buffer Clock FREQUENCY | | | | Memory DATA | |
|------|------|------|------|------|------|------|------|------|------|------|
| | S1 | S2 | S3 | S4 | Buffer 1 | Buffer 2 | Buffer 3 | Buffer 4 | Write | Read |
| T1 | B1 | | | | f | | | | | |
| T2 | B1 | B1 | | | f | f | | | | |
| T3 | B2 | B2 | B3 | B3 | f2 | f2 | f3 | | Data 1 | |
| T4 | B2 | B2 | B4 | B3 | f | f | f | f3 | Data 2 | Data 1 |
| T5 | B1 | B1 | B3 | B4 | f | f | f | f | Data 3 | Data 2 |
| T6 | B1 | ----- | ----- | B4 | f2 | f2 | ----- | f | ----- | Data 3 |
| T7 | B2 | B2 | ----- | ----- | ----- | ----- | ----- | ----- | ----- | ----- |
| T8 | B2 | B1 | ----- | ----- | ----- | ----- | ----- | ----- | ----- | ----- |
| ----- | ----- | ----- | ----- | ----- | ----- | ----- | ----- | ----- | ----- | ----- |
| 2Ti | B1 | B2 | B4 | B3 | f | f | f | f3 | Data (i-1) | Data (i-1) |
| 2Ti+1 | B1 | B1 | B3 | B3 | f | f | f | f | Data (i) | Data (i) |
| 2Ti+2 | B2 | B2 | B4 | B4 | f2 | f2 | f3 | f | Data (i+1) | Data (i+1) |
| 2Ti+3 | B2 | B1 | B3 | B4 | f | f | f | f | Data (i+2) | Data (i+2) |
| 2Ti+4 | B1 | B2 | B4 | B3 | f | f | f | f3 | Data (i+3) | Data (i+3) |
| 2Ti+5 | B1 | B1 | B3 | B3 | f2 | f2 | f3 | f | ----- | ----- |
| 2Ti+6 | B2 | B2 | B4 | B4 | f | f | f | f | | |
| 2Ti+7 | B2 | B1 | B3 | B4 | f | f | f | f3 | | |
| 2Ti+8 | B1 | B2 | B4 | B3 | ----- | ----- | ----- | ----- | | |
| 2Ti+9 | B1 | ----- | ----- | ----- | | | | | | |

FIG. 3

SOLID-STATE AUDIO RECORDING UNIT

BACKGROUND OF THE INVENTION

1. Field of the Invention

The present invention relates to a solid-state audio recording unit for recording/playing back sounds by using a solid-state storing medium, such as a semiconductor memory, and, more particularly, to a solid-state audio recording unit having a recording confirming function.

2. Description of the Prior Art

An apparatus is known that digitally converts sound signals inputted from a microphone and then records the converted signals into a solid-state recording medium, such as a semiconductor memory (solid-state audio recording unit). This type of solid-state audio recording unit only digitally converts the input signals to be recorded in the memory and performs playback after completion of recording.

Therefore, a user can not perceive the situation that the recording actually failed unless the playback is performed after completion of the recording, even if the recording was not actually carried out due to an erroneous operation or the like.

It is to be noted that, in a recording apparatus using an analog tape, it is known that one can confirm whether the recording is actually performed on a real-time basis by using a playback head to reproduce signals recorded by a recording head in a so-called three-head mechanism, the playback head being provided immediately behind the recording head.

However, in a solid-state audio recording unit using the semiconductor memory, a recording confirming function is not known.

Incidentally, a dual-port memory may be used for simultaneously performing input and output in case of processing image data, but this type of memory is expensive and it is not suitable for holding the recorded audio data.

SUMMARY OF THE INVENTION

The present invention is aimed to solve the above-described problems, and an object thereof is to realize a solid-state audio recording unit being capable of confirming whether the normal recording is being carried out on a real-time basis.

The present invention provides a solid-state audio recording unit to deliver, while storing incoming audio data into a memory, audio data stored in the memory as an output on a real-time basis comprising two input buffers for alternately holding incoming audio data; a memory for storing audio data; two output buffers for holding audio data read from the memory; and a control means which, during a period when it forces one of the two input buffers to hold audio data according to a reference clock, and one of the two output buffers to deliver audio output outside according to the reference clock, writes audio data held by the other input buffer into the memory according to a second clock having a higher frequency than the foregoing reference clock; during a residual time of said period, reads audio data written into the memory according to a third clock having a higher frequency than the foregoing reference clock, and forces the other output buffer to hold them; and repeats the same operation alternately between the two input buffers and the two output buffers.

Although one of the input buffers which receives the incoming audio data from outside operates at a standard speed, the other input buffer which stores the audio data in the memory operates at a high speed. The successive data can be inputted/outputted by alternately operating these two input buffers.

Similarly, one output buffer which receives the audio data from the memory operates at a high speed, but the other output buffer for outputting the audio data to outside operates at a standard speed. In other words, when the data is stored in and read from the memory at a high speed, an operation such that input and output are performed at the same time deceptively is enabled even if the input/output port uses the single memory. As a result, the audio data stored in the memory can be outputted on a real-time basis.

It is to be noted that at least one of the second and third clocks has a frequency two or more times that of the reference clock.

The present invention further may comprise compressing means for compressing audio data to be written from the input buffer into the memory; and expanding means for expanding audio data to be read from the memory and held by the output buffer.

BRIEF DESCRIPTION OF THE DRAWINGS

Modes for embodying the present invention will now be described with reference to the accompanying drawings, in which:

FIG. 3 is an explanatory view showing the operation state of the solid-state audio recording unit according to the embodiment of the present invention;

DESCRIPTION OF THE PREFERRED EMBODIMENTS

Figure 1:
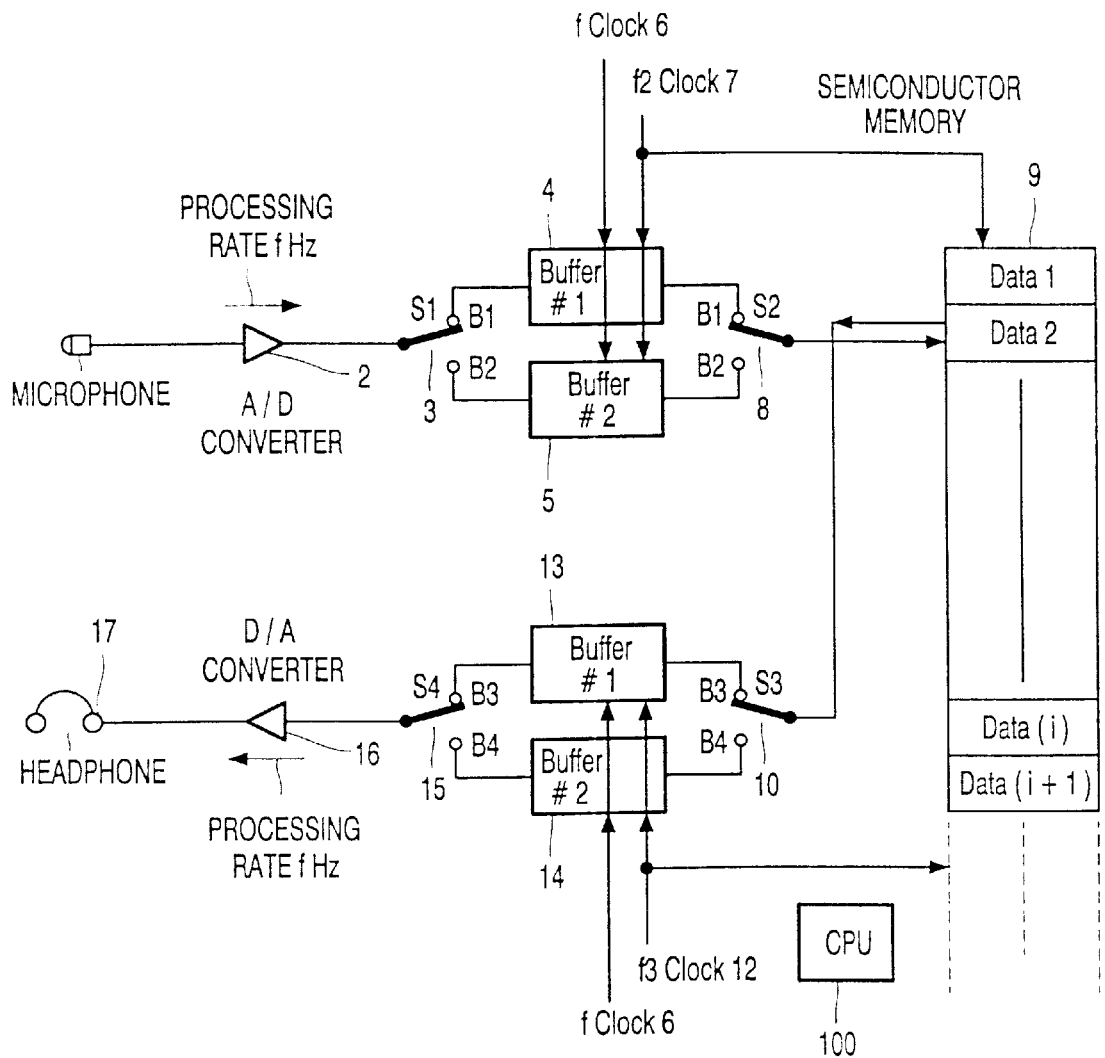
FIG. 1 is a block diagram showing the structure of a solid-state audio recording unit according to one embodiment of the present invention.

FIG. 1 is a block diagram showing the structure of a solid-state audio recording unit in each embodiment of the present invention. In FIG. 1, reference numeral 1 denotes a microphone (this will be referred to as a mike hereunder) for converting a sound into an electric signal (sound signal); 2, an A/D converter for analog-to-digital-conversion of the electric signal from the mike 1 to generate audio data; 3, a switch for portioning out the audio data; 4, one input buffer (Buffer#1) for holding the audio data; 5, another input buffer (Buffer#2) for holding the audio data; 6, a first clock having a frequency f for driving the input buffers and later-described output buffers at a standard speed; 7, a second clock having a frequency f2 for driving the input buffers at a speed higher than the standard speed; 8, a switch for selectively passing the audio data held in the two input buffers; 9, a semiconductor memory as a storing means for storing the audio data; 10, a switch for portioning out the audio data read from the memory 9 to the two output buffers; 12, a third clock having a frequency f3 for driving the output buffers at a speed higher than the standard speed; 13, one output buffer (Buffer#3) for holding the audio data; 14, another output buffer (Buffer#4) for holding the audio data;

15, a switch for selectively passing the audio data held in the two output buffers; 16, a D/A converter for digital-to-analog conversion of the digital audio data to an analog sound signal; 17, a headphone for converting the sound signal into sound; and 100, a CPU as a controlling means for controlling the changeover control of each switch or the writing/reading control with respect to the buffer/memory. Further, a mike 1 may be included in the main body of the apparatus.

It is to be noted that the wiring from the CPU to each part is omitted. Furthermore, it is determined that the mike 1 and the headphone 17 are detachably provided to the main body of the solid-state audio recording unit.

The sound signal from the mike 1 is converted into the audio data in the form of a digital signal by the A/D converter 2. In the prior art, the digital audio data is directly written in the semiconductor memory 9. In the present embodiment, the two input buffers 4 and 5 are additionally provided, and the input buffers 4 and 5 are operated with the clock 6 having the frequency f when writing the data and operated with the clock 7 having the frequency f2 which is twice or more as high as that of the clock 6 when reading the data.

Here, the input buffers 4 and 5 perform a so-called Ping-Pong action such that one reads the data when the other writes the data by the switches 3 and 8 provided to the input/output side, thereby preventing the signals from being disrupted.

In this example, the writing speed to the semiconductor memory 9 depends on the clock 7, and the clock 7 is twice or more the above-described clock 6. That is, when n items of audio data are held in the input buffers 4 and 5 with a unitary predetermined time t [second] being used, the data can be written into the semiconductor memory 9 within the time of t/2 [second]. Assuming that the time required for writing the data into the semiconductor memory 9 is tw [second], the following equation can be obtained:

$$tw = N \cdot (1/f2) \tag{1}$$

The time tr required for n items of the audio data to be sent to the semiconductor memory 9 can be expressed as follows:

$$tr = t - tw = t - N \cdot (1/f2) \tag{2}$$

Thus, if n items of the written audio data can be read from the semiconductor memory 9 in the time tr, the audio data stored in the semiconductor memory 9 can be outputted and monitored on a real-time basis.

The clock frequency f3 used for confirming the writing is as follows:

$$f3 \cdot N/(t-tw) \tag{3}$$

The above-described audio data read from the semiconductor memory 9 by using the clock 12 having the frequency f3 is continuously read by the Ping-Pong action effected by the output buffers 13 and 14 and the switches 10 and 15. When the reading clock from the output buffer has the frequency which is the same with that of the clock at the time of input to the input buffer, the audio data to be reproduced is returned to its original state. The audio data returned to its original state is converted into the analog sound signal by the D/A converter and outputted from the headphone 17.

Figure 2:
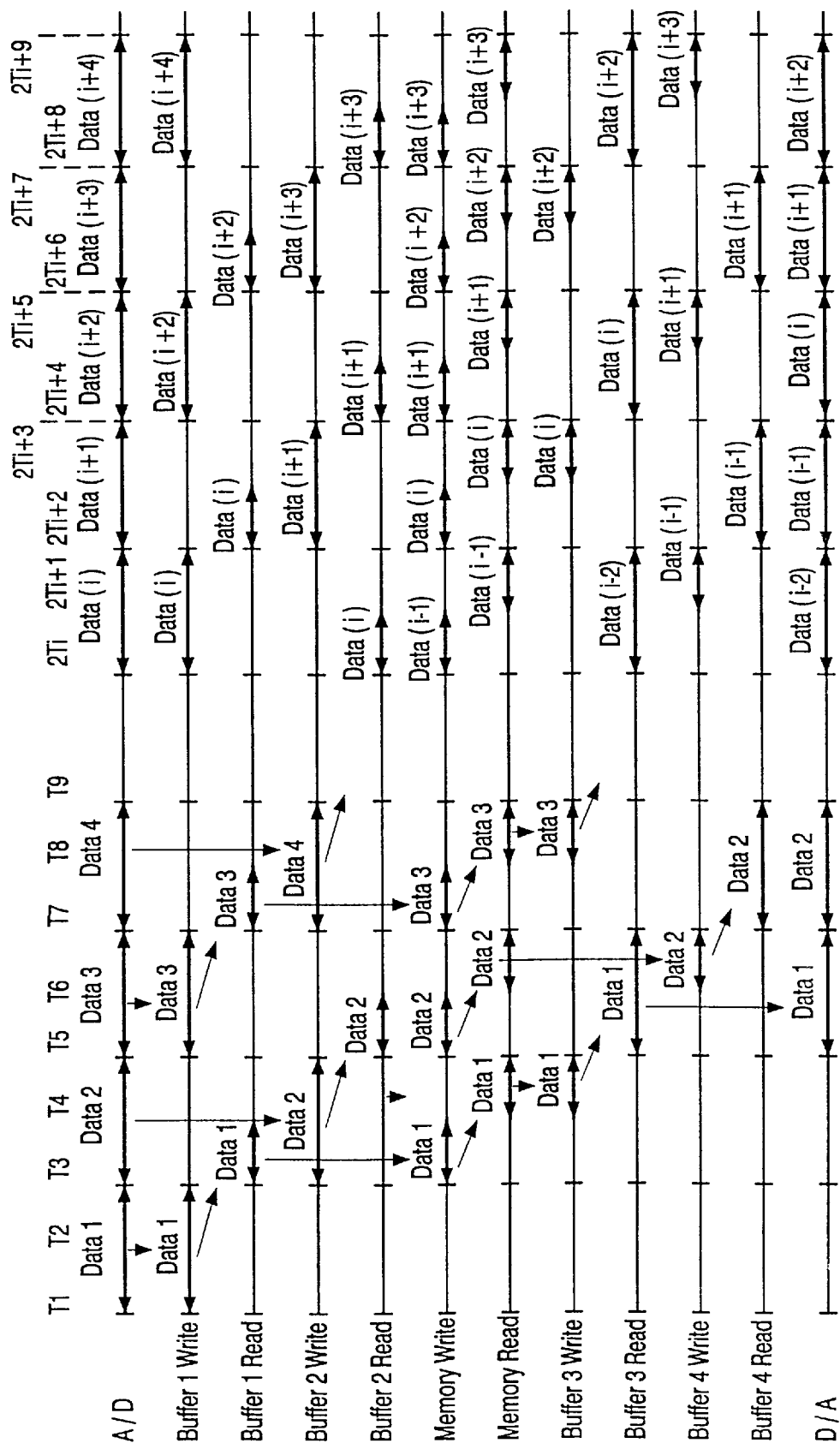
FIG. 2 is a time chart showing the operation state of the solid-state audio recording unit according to the embodiment of the present invention.

Incidentally, the above-mentioned operation is as shown by the time chart of FIG. 2. Further, the relationship between the changeover state of the switches and the clock frequencies is as shown in FIG. 3. These drawings show that the interval between the respective times T1, T2, T3, . . . can be expressed as the above-mentioned t/2 [second]. The unit of the n items of the audio data is represented as Data(1), Data(2), Data(3), . . . .

Although repeated explanation will be omitted, it is apparent that the sound signal from the mike 1 can be stored and the stored content can be continuously read and monitored in substantially real-time by writing the audio data in the semiconductor memory 9 with the high-speed clock and reading the same at the high speed in the remaining time.

It is to be noted that the similar operation is enabled by preparing a plurality of semiconductor memories 9 for the Ping-Pong action when using no input buffer and output buffer. In case of using a detachable card-type flash memory such as a PCMCIA, however, use of a single memory is enough, and hence the above-described technique using the input buffers and the output buffers is realistic.

The above embodiment has a structure such that the frequency f2 of the second clock is first obtained and the reverse operation is executed based on this result to further obtain the third clock frequency f3. However, the same operation is possible even if the third clock frequency f3 is first obtained and the reverse operation is executed to further obtain the second clock frequency f2. Here, the flash memory is employed as the semiconductor memory 9, the writing time is generally longer than the reading time. It is therefore desirable to set the second clock frequency f2 to be lower than the third clock frequency f3.

Figure 4:
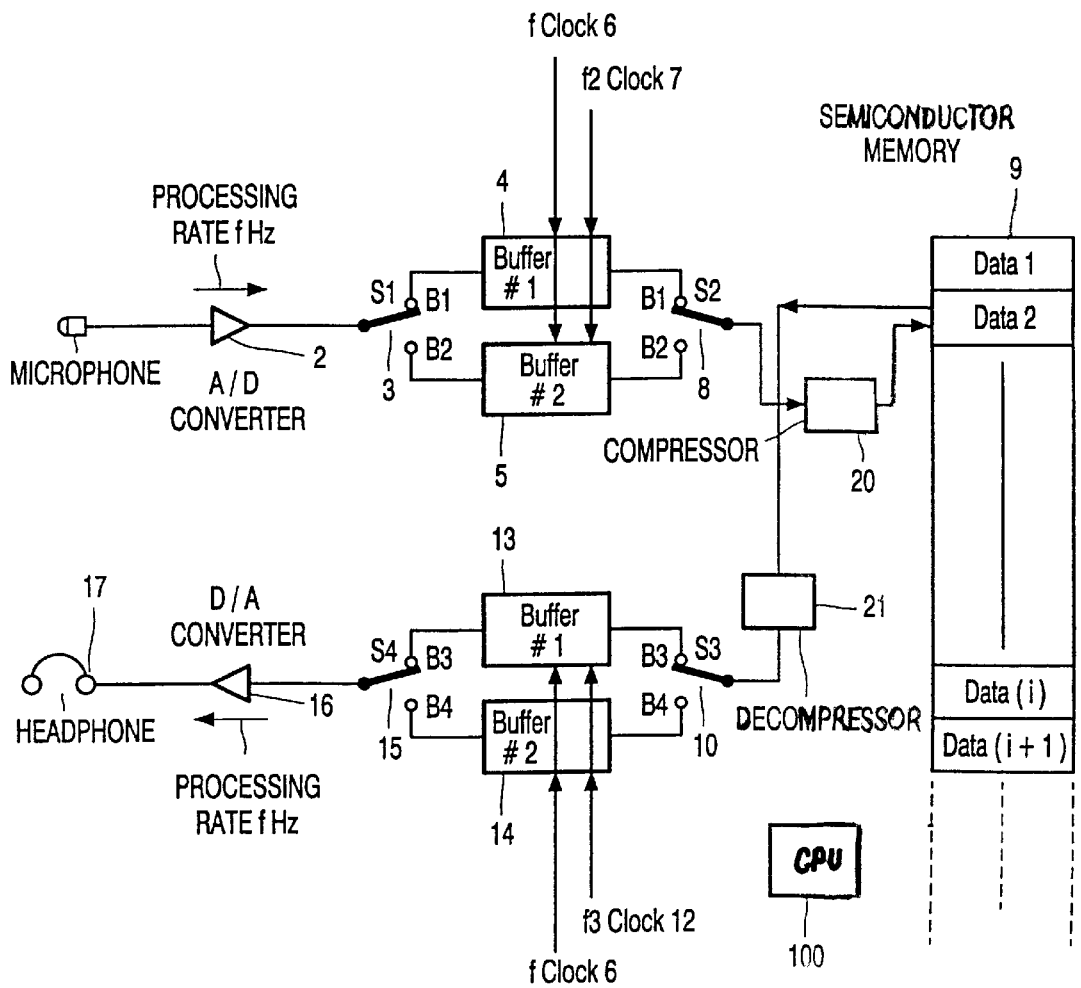
FIG. 4 is a block diagram showing the structure of a solid-state audio recording unit according to another embodiment of the present invention.

FIG. 4 is a block diagram showing the structure of another embodiment according to the present invention. This example employs such a structure that the audio data compressed by the compressor 20 is written in the semiconductor memory 9. In this case, a quantity of data is reduced by compression, which shortens the time required for writing the data into the semiconductor memory 9. Assuming that the data of the time t [second] before compression is compressed to the data of the time tc [second] and decompressed to the data of the time td [second], the operation similar to the above is possible when the following condition is satisfied:

$$t > tc + td \tag{4}$$

Here, the audio data string which is inputted by the Ping-Pong action from the input buffers 4 and 5 and has a period t is subjected to data compression by the compressor 20 and written into the semiconductor memory 9 in the time tc. The compressed data read from the semiconductor memory 9 is then decompressed by the decompressor 21 in the time td and supplied to the output buffers 13 and 14. The audio data temporarily stored in the output buffers 13 and 14 is read out by the Ping-Pong action with the original frequency and outputted from the headphone 17 as the continuous sound signals.

Figure 5:
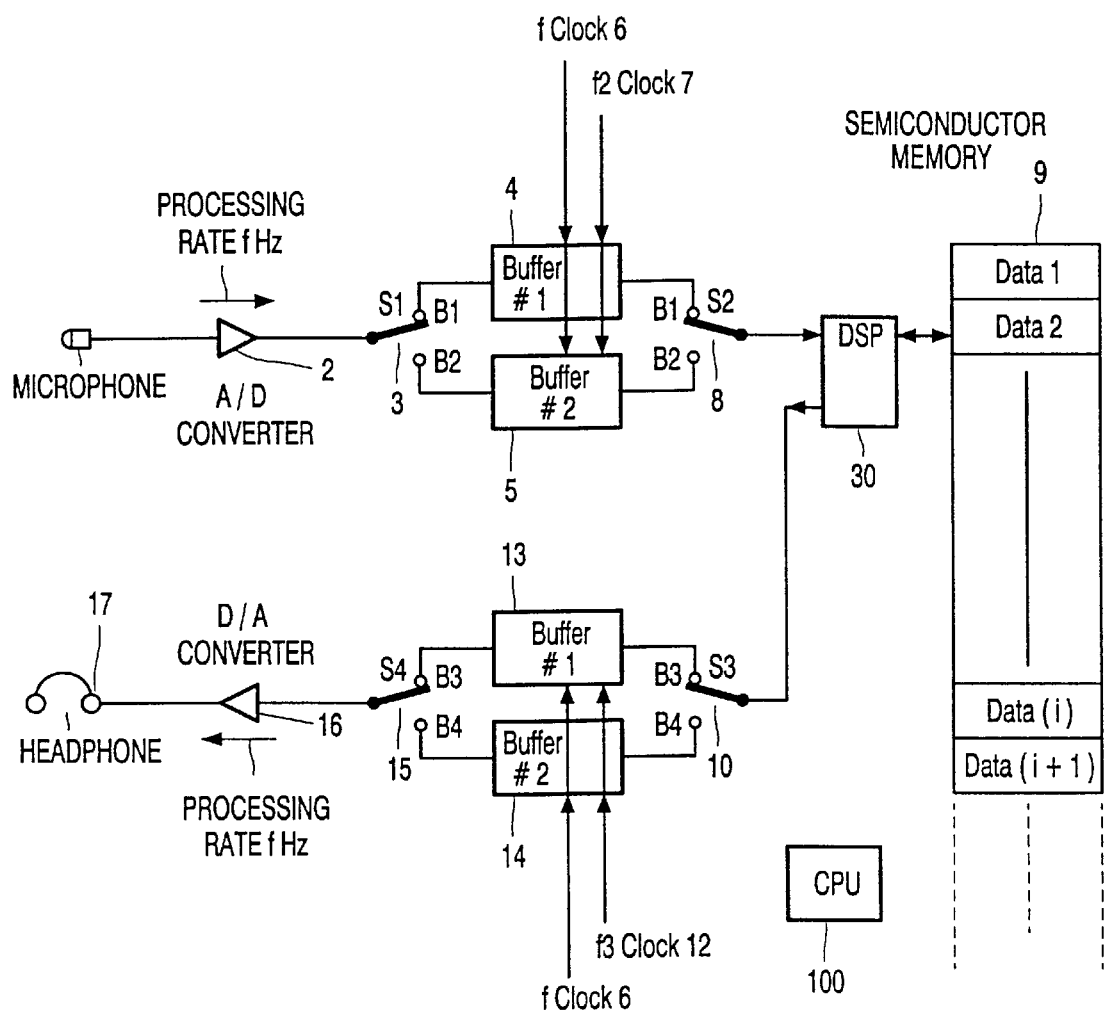
FIG. 5 is a block diagram showing the structure of a solid-state audio recording unit according to a further embodiment of the present invention.

Further, FIG. 5 is a block diagram showing a further embodiment according to the present invention. In this illustrative example, compression and decompression of the data is effected by the DSP (digital signal process) 30 in terms of software. In this case, the DSP 30 is provided between the buffers, i.e., the input and output buffers 4, 5, 13 and 14 and the semiconductor 9. If the total time obtained from compression and decompression carried out by the DSP 30 is smaller than the above-mentioned t, the recorded state can be outputted on a real-time basis as similar to that obtained by the compression and decompression operation in FIG. 4.

Although the input and output buffers 4, 5, 13 and 14 used in the present invention can be configured by general purpose solid-state memories, such as a DRAM or an SRAM, they may be configured by FIFO which can individually set the writing speed and the reading speed.

As described above in detail, in the solid-state audio recording unit according to the present invention explained in this specification, since one input buffer that receives the incoming audio data from outside operates at a standard speed while the other input buffet that stores the audio data in the memory operates at a high speed and one output buffer that receives the audio data from the memory operates at a high speed while the other output buffer that outputs the audio data to outside at a standard speed, it is possible to secure such an operation as that input and output are carried out at the same time deceptively by storing and reading the data in/from the memory at a high speed even though the input/output port uses a single memory, thereby outputting the audio data stored in the memory on a real time basis.

What is claimed is:

1. A solid-state audio recording unit for outputting, while storing incoming audio data into a memory, audio data stored in the memory on a real-time basis, said solid-state audio recording unit comprising:

two input buffers for alternately holding incoming audio data;

a memory for storing audio data;

two output buffers for alternately holding audio data read from the memory; and control means for controlling the two input buffers and the two output buffers, said control means, during a period, controlling one of the two input buffers to hold audio data according to a reference clock, and one of the two output buffers to output audio data according to the reference clock, during a first part of the period, controlling the audio data held by the other input buffer to be written into the memory according to a second clock having a higher frequency than the reference clock, and, during a residual time of said period other than said first part, controlling audio data already written into the memory to be read from the memory and written into the other of the two output buffers according to a third clock having a higher frequency than the reference clock, said control means repeating the same operation alternately between the two input buffers and the two output buffers.

2. A solid-state audio recording unit as described in claim 1, wherein at least one of the second and third clocks has a frequency two or more times that of the reference clock.

3. A solid-state audio recording unit as described in claim 1, wherein the solid-state audio recording unit further comprises:

compressing means for compressing audio data to be written from one of the two input buffers into the memory; and expanding means for expanding audio data to be read from the memory and held by one of the two output buffers.

* * * * *